(12) United States Patent
Toya

(10) Patent No.: US 9,007,762 B2
(45) Date of Patent: Apr. 14, 2015

(54) SERVER RACK, ELECTRONIC APPARATUS, AND ELECTRONIC APPARATUS PROTECTION METHOD

(71) Applicant: Mitsunobu Toya, Ome (JP)

(72) Inventor: Mitsunobu Toya, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 342 days.

(21) Appl. No.: 13/713,781

(22) Filed: Dec. 13, 2012

(65) Prior Publication Data

US 2013/0286576 A1    Oct. 31, 2013

(30) Foreign Application Priority Data

Apr. 25, 2012    (JP) .................................. 2012-099929

(51) Int. Cl.
*H05K 7/20* (2006.01)
*G06F 1/18* (2006.01)
*H05K 7/14* (2006.01)

(52) U.S. Cl.
CPC .............. *G06F 1/182* (2013.01); *H05K 7/1495* (2013.01)

(58) Field of Classification Search
None
See application file for complete search history.

(56) References Cited

U.S. PATENT DOCUMENTS

| 5,071,203 | A  | * | 12/1991 | Boyd ............................. 312/7.2 |
| 6,846,583 | B2 |   | 1/2005  | Inaba et al. |
| 2004/0217072 | A1 | * | 11/2004 | Bash et al. ....................... 211/26 |
| 2004/0264124 | A1 | * | 12/2004 | Patel et al. ..................... 361/686 |
| 2007/0147010 | A1 | * | 6/2007  | Arnel et al. .................... 361/727 |
| 2012/0087085 | A1 | * | 4/2012  | Moore et al. ............. 361/679.46 |

FOREIGN PATENT DOCUMENTS

| JP | 03-164999 | 7/1991 |
| JP | 2002-541671 | 12/2002 |
| JP | 2007-004945 | 11/2007 |

* cited by examiner

*Primary Examiner* — Gregory Thompson
(74) *Attorney, Agent, or Firm* — Blakely, Sokoloff, Taylor & Zafman LLP

(57) ABSTRACT

According to one embodiment, a server rack includes a server, a housing which includes a ventilation opening part, and surrounds the server, a water sensor which is provided outside the housing and senses water, a closing member which is movable between a first position in which the closing member is dislocated from the opening part and a second position in which the closing member covers the opening part, a moving mechanism which moves the closing member from the first position to the second position, an adhering mechanism which brings the closing member that has moved to the second position into close contact with the housing, and a controller which operates the moving mechanism and the adhering mechanism, when the water sensor senses water.

11 Claims, 10 Drawing Sheets

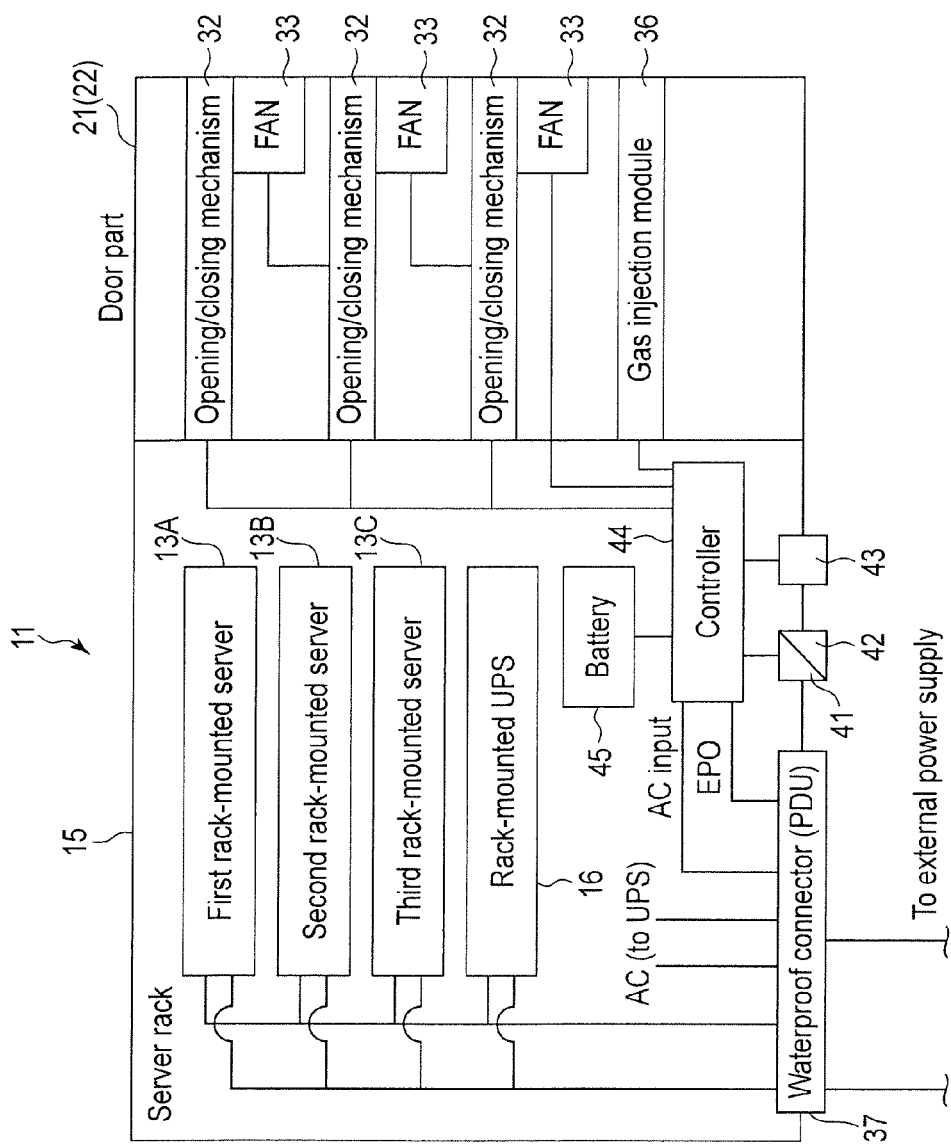
F I G. 2

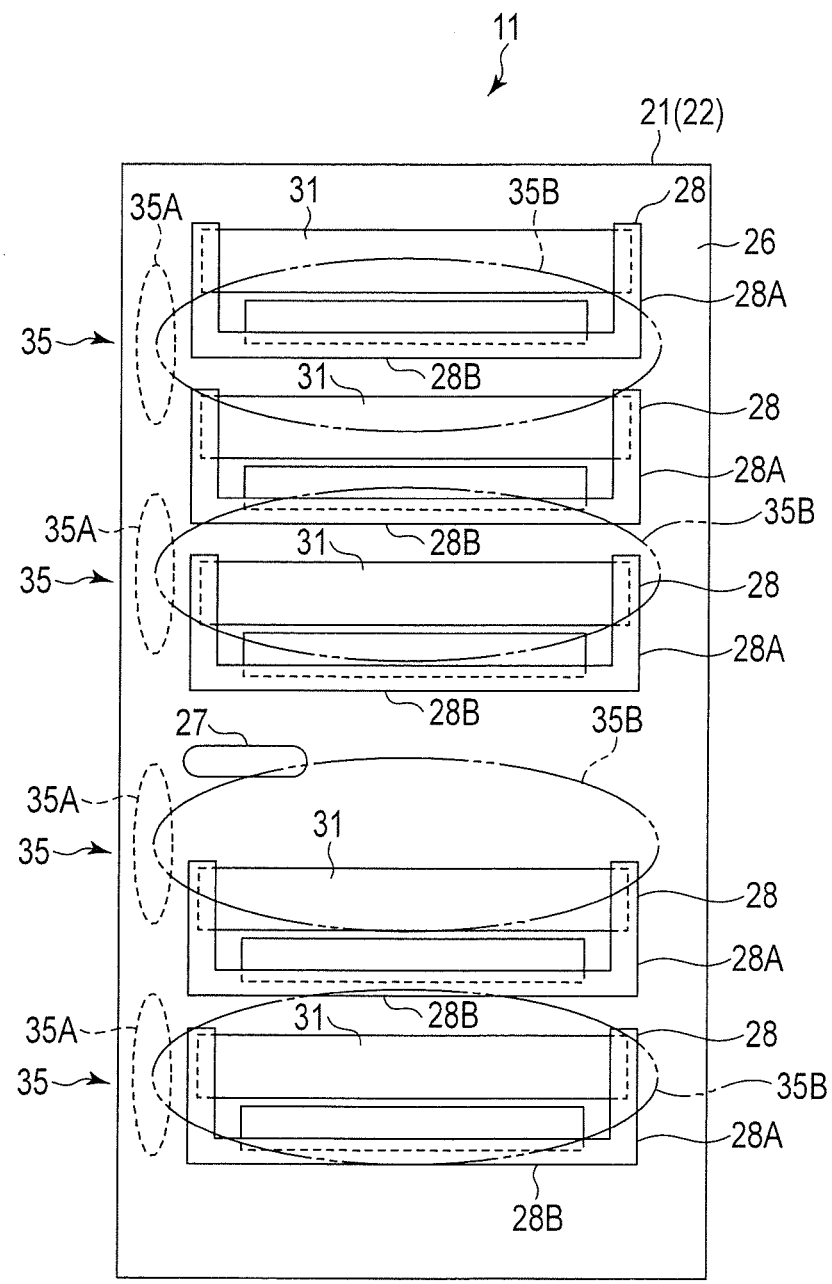
F I G. 3

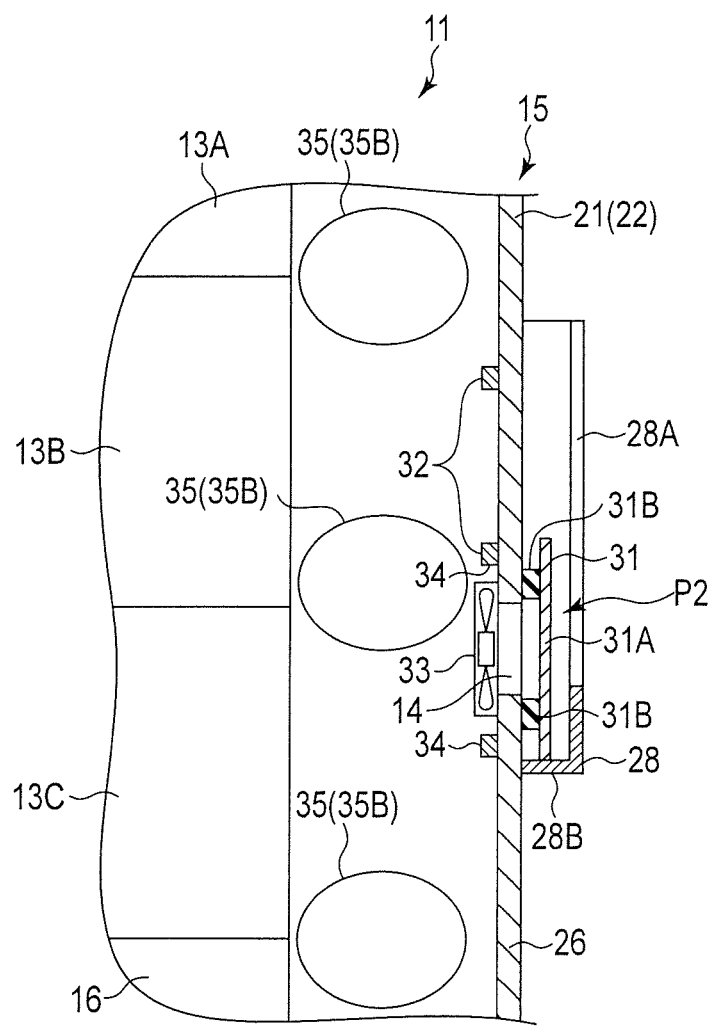
F I G. 5

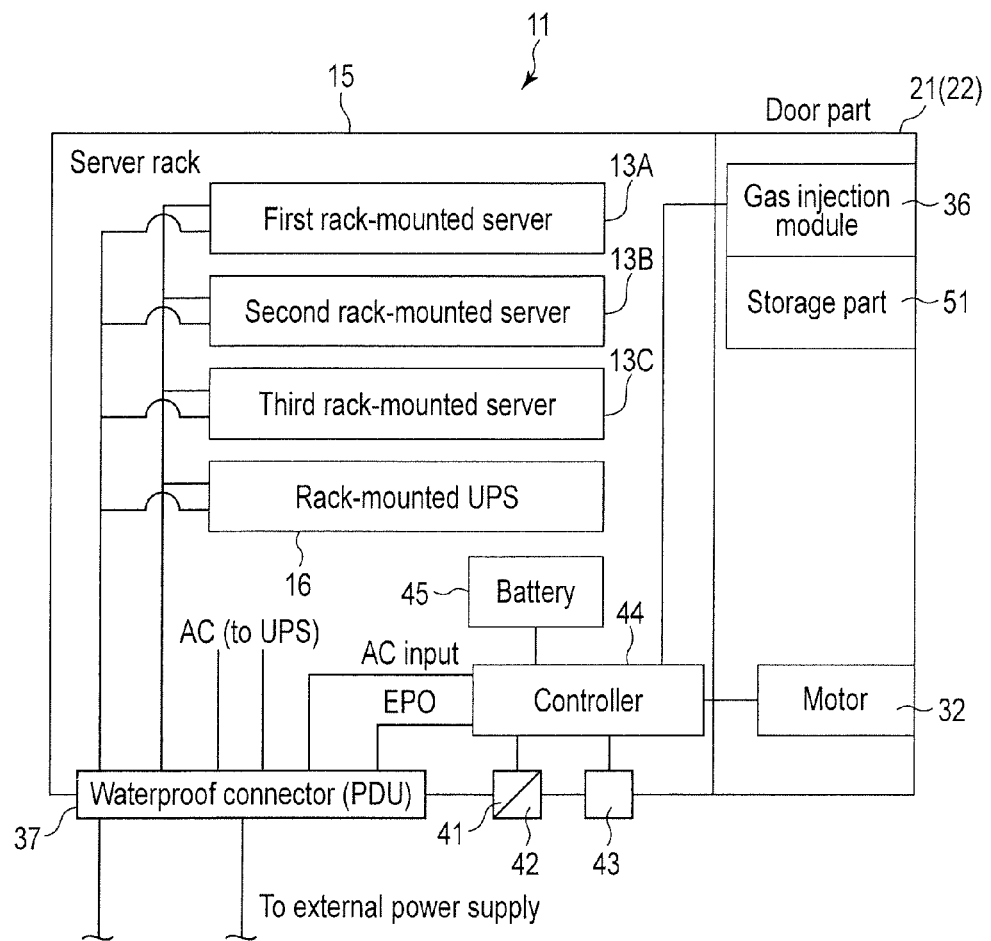
F I G. 6

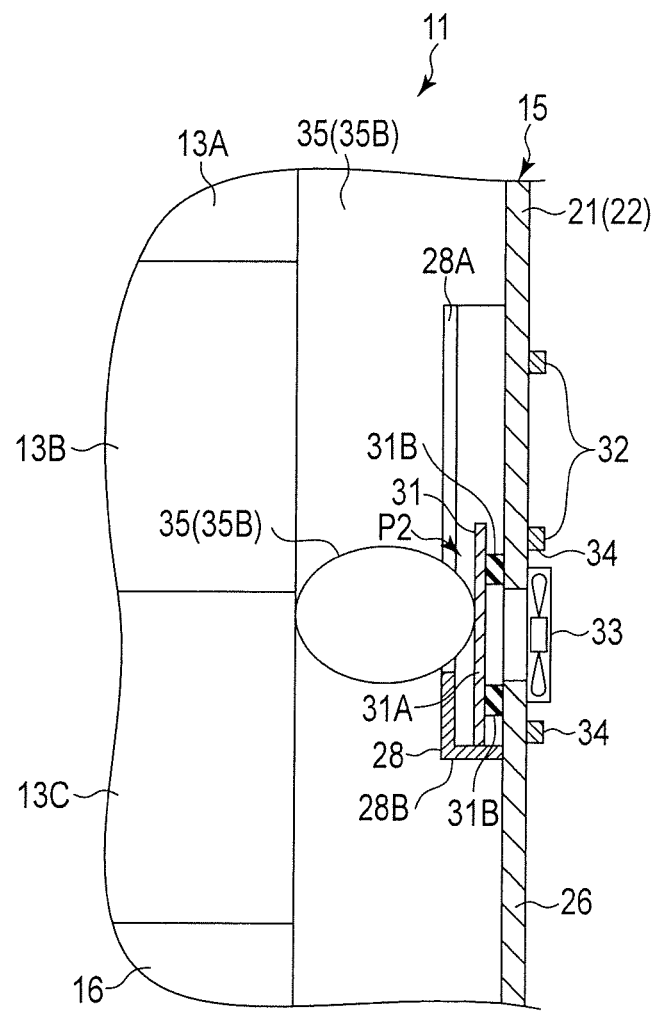
F I G. 10

US 9,007,762 B2

SERVER RACK, ELECTRONIC APPARATUS, AND ELECTRONIC APPARATUS PROTECTION METHOD

CROSS-REFERENCE TO RELATED APPLICATIONS

This application is based upon and claims the benefit of priority from Japanese Patent Application No. 2012-099929, filed Apr. 25, 2012, the entire contents of which are incorporated herein by reference.

FIELD

Embodiments described herein relate generally to a server rack which includes a housing that includes an opening part, an electronic apparatus, and an electronic apparatus protection method.

BACKGROUND

There are housings which are equipped with a fire alarm. The housings close a shutter that is provided on an outlet port of a fan to shut out air ventilation when a fire is detected, and check the spread of the fire.

Recently, with increase in awareness of disaster prevention, there are needs for electronic apparatuses which are resistant to disasters.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 2 is an exemplary block diagram illustrating a whole configuration of the server rack illustrated in FIG. 1.

FIG. 3 is an exemplary front view of a first wall of a housing of the server rack illustrated in FIG. 1.

FIG. 5 is an exemplary cross-sectional view of the closing member located in a second position and a part around the closing member, in the server rack illustrated in FIG. 4.

FIG. 6 is an exemplary block diagram illustrating a whole configuration of a server rack which is an example of an electronic apparatus according to a second embodiment.

FIG. 10 is an exemplary cross-sectional view illustrating the closing member located in a second position and the part around the closing member, in the server rack illustrated in FIG. 9.

DETAILED DESCRIPTION

Various embodiments will be described hereinafter with reference to the accompanying drawings.

In general, according to one embodiment, a server rack includes a server, a housing which includes a ventilation opening part, and surrounds the server, a water sensor which is provided outside the housing and senses water, a closing member which is movable between a first position in which the closing member is dislocated from the opening part and a second position in which the closing member covers the opening part, a moving mechanism which moves the closing member from the first position to the second position, an adhering mechanism which brings the closing member that has moved to the second position into close contact with the housing, and a controller which operates the moving mechanism and the adhering mechanism, when the water sensor senses water.

Figure 1:
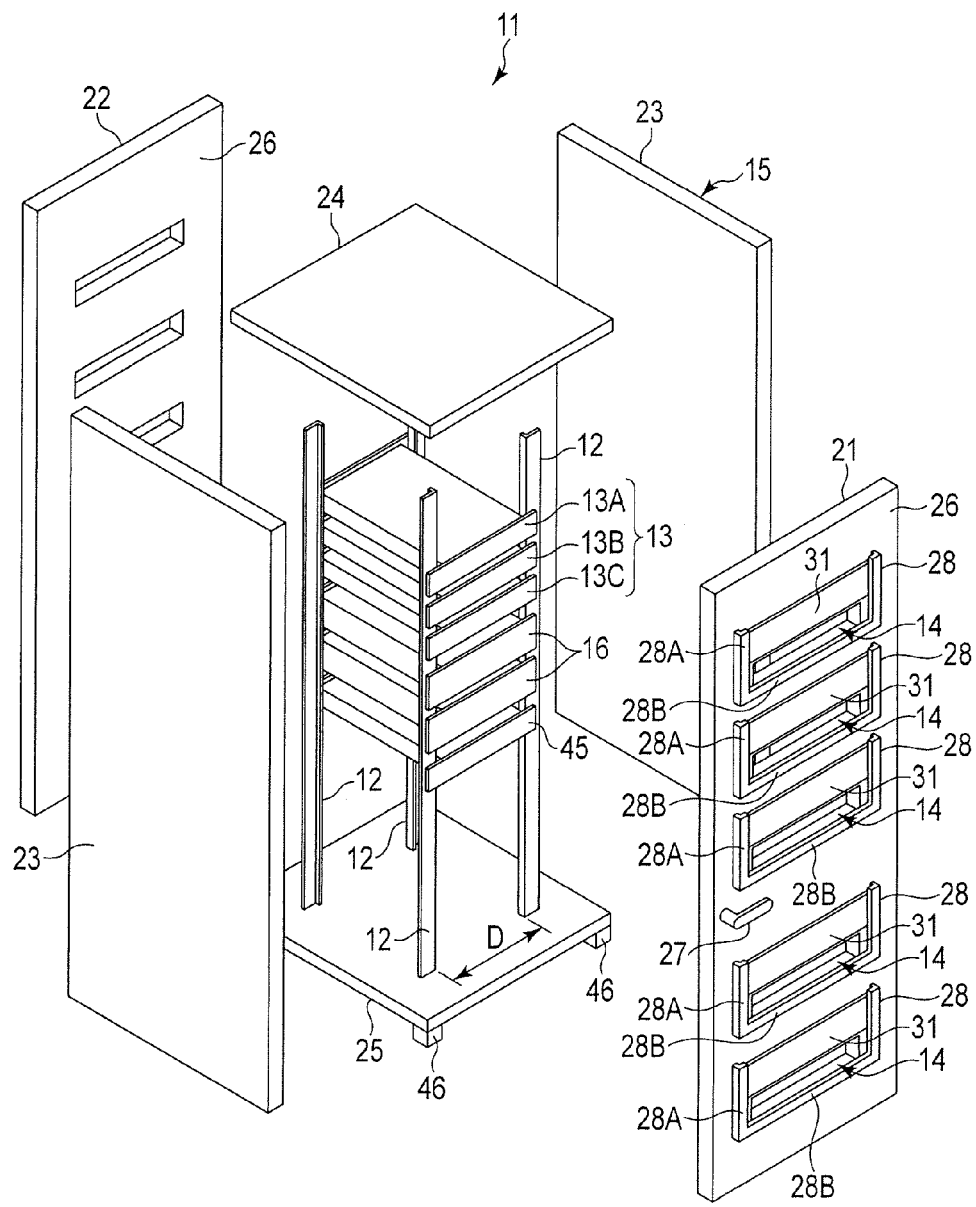
FIG. 1 is an exemplary exploded perspective view of a server rack, which is an example of an electronic apparatus according to a first embodiment, illustrating the inside of the server rack.

A first embodiment of an electronic apparatus will be explained hereinafter with reference to FIG. 1 to FIG. 5. As illustrated in FIG. 1, a server rack 11 which is an example of an electronic apparatus of the present embodiment includes a plurality of servers, and has a box-shaped external appearance as a whole.

As illustrated in FIG. 1, the server rack 11 (rack apparatus) comprises four rack parts 12 (supports, rack main bodies) which are provided to correspond to corner part positions, first to third rack-mounted servers 13A to 13C (first to third servers, first to third server units) which are fixed to the rack parts 12, a housing 15 which surrounds the rack parts 12 and the rack-mounted server 13 and includes a plurality of opening parts 14 for ventilation, and two uninterruptible power supplies (UPSs) 16 (first UPS and second UPS) which are fixed to the rack parts 12. A space D (width) between rack parts 12 is, for example, 19 inches (about 480 mm), so that the rack parts 12 are generally referred to as a "19-inch rack". Each of the rack parts 12 extends vertically.

Each of the first and second rack-mounted servers 13A and 13B includes, for example, a hard disk drive (HDD), and is used as a file server which stores a large volume of data. The third rack-mounted server 13C is, for example, a server for a specific purpose. The third rack-mounted server 13C is, for example, an IP telephone server which is used in an office or the like, and supplies a telephone function to IP telephones through a WAN or LAN. Each rack-mounted server 13 has a thickness of, for example, 1 U (about 7 centimeters). The server rack 11 may further include a firewall which is mounted on the rack parts 12.

The housing 15 is formed of, for example, a metal material. The housing 15 includes a first wall 21 (front door, door part), a second wall 22 (back door, door part), a pair of third walls 23 (sidewalls), a fourth wall 24 (top wall) which forms a top plate, and a fifth wall 25 (bottom wall) which forms a bottom plate.

The first wall 21 and the second wall 22 have almost the same structure. Specifically, the first wall 21 (the second wall 22) includes a door main body 26, a handle part 27 which is provided on the door main body 26 and configured to open and close the door main body 26 with respect to the other parts of the housing 15, a plurality of opening parts 14 which are provided in the door main body 26, and a plurality of receiving parts 28 which are provided in the vicinity of the respective opening parts 14. Each opening part 14 is formed in a rectangular shape which is, long in the horizontal direction. The receiving parts 28 hold closing members 31, which are explained later, such that the closing members 31 are movable between a first position P1 and a second position P2.

Figure 4:
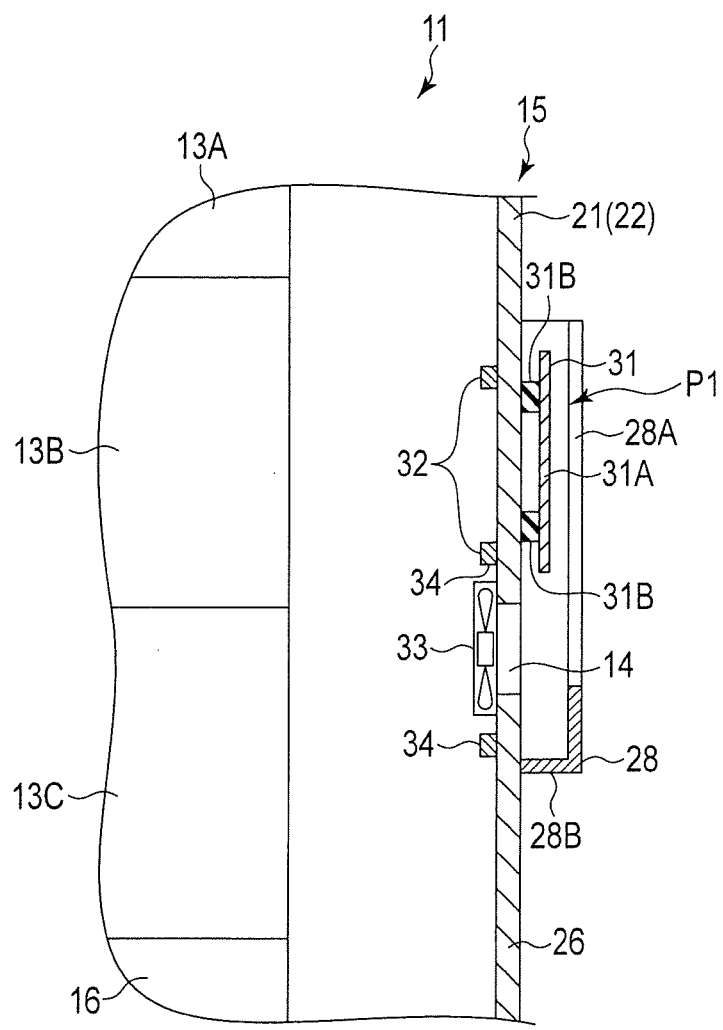
FIG. 4 is an exemplary cross-sectional view of a closing member located in a first position and a part around the closing member, which are cut in a vertical direction, in the server rack illustrated in FIG. 1.

Each receiving part 28 is formed in, for example, a U-shape along the outer edge of the corresponding opening part 14. Each receiving part 28 includes a guide part 28A which extends in a vertical direction (direction which is parallel with the rack parts 12) and guides movement of the closing member 31 from the first position P1 to the second position P2, and a holding part 28B which extends in the horizontal direction (direction which is perpendicular to the rack parts 12) to receive and hold the closing member 31 which has been dislodged into the second position P2. Each pair of the guide part 28A and the holding part 28B has an L-shaped cross section, as illustrated in FIG. 1 and FIG. 4. A closing member 31 is movably provided inside each receiving part 28 (a space between the receiving part 28 and the door main body 26).

As illustrated in FIG. 2 and FIG. 4, the server rack 11 further comprises a plurality of closing members 31 (covering plate) configured to cover the respective opening parts 14, a plurality of opening/closing mechanisms 32 (moving mechanisms) configured to move the respective closing members 31, a plurality of fan units 33 which are provided close to the opening parts 14 and promote air ventilation in the opening parts 14, a plurality of adhering mechanisms 34 which adhere the closing members 31 to the housing 15, a plurality of air bags 35 which can be expanded between the rack-mounted servers 13 and the internal surface of the housing 15, a gas injection module 36 which injects gas into the air bags 35, a waterproof connector 37 which is provided in a part of the housing 15 (to be exposed to the exterior) and connected to an external power source, a first sensor 41 (sensor, earthquake sensor, acceleration sensor) which is capable of sensing an earthquake (acceleration), a second sensor 42 (sensor, water sensor) which is capable of sensing water, a third sensor 43 (sensor, smoke sensor, fire sensor) which is capable of sensing smoke, a controller 44 (controller) which controls the opening/closing mechanisms 32, the adhering mechanisms 34, the fan units 33, and the waterproof connector 37, a battery 45 which is attached to a part under the UPSs 16 of the rack parts 12, and caster parts 46 which are attached to the bottom of the housing 15.

The first sensor 41 is provided, for example, inside the housing 15. The second sensor 42 is provided outside the housing 15 and in a position exposed to the exterior. The third sensor 43 is provided outside the housing 15 and in a position exposed to the exterior. The third sensor 43 may be provided inside the housing 15, or provided both inside and outside the housing 15.

The waterproof connector 37 (drop-proof connector) includes a power distribution unit (PDU) which controls turning on/off of power supply to the UPSs 16 and the controller 44. The fan units 33 which are attached to the first wall 21 (front door) can supply, for example, cold air into the housing 15 through the opening parts 14. The fan units 33 which are attached to the second wall 22 (back door) can discharge, for example, the heated air in the housing 15 to the outside of the housing 15 through the opening parts 14.

Each UPS 16 stores electric power in the built-in battery 45, and can supply electric power to the rack-mounted servers 13 (servers) in power failure or the like, and maintain the operation state of the rack-mounted servers 13 for a predetermined time. When power supply from the waterproof connector 37 is cut out (when the breaker is operated) in an emergency, each UPS 16 supplies electric power to the rack-mounted servers 13 (servers) for a predetermined time, and transmits a shut-down signal to each rack-mounted server 13 to securely shut down each rack-mounted server 13. FIG. 2 illustrates only one UPS 16. Each UPS 16 has a thickness of, for example, 2 U (about 14 centimeters).

The battery 45 supplies electric power to the controller 44, when electric power supply from the exterior (electric power supply through the waterproof connector 37 described later) is cut out in an emergency. Thereby, the first to third sensors 43 described later can continue monitoring for a certain time even after the external power supply is cut out. In such an emergency, the battery 45 also supplies electric power to the opening/closing mechanisms 32 and the gas injection module 36 through the controller 44. The battery 45 has a thickness of, for example, 1 U (about 7 centimeters).

The closing members 31 are provided outside the housing 15. The closing members 31 are attached to the first wall 21 and the second wall 22 of the housing 15. As illustrated in FIG. 3, each closing member 31 has a square plate shape which is larger than the opening part 14, to cover the whole opening part 14. As illustrated in FIG. 4 and FIG. 5, each closing member 31 can move between a first position P1 in which the closing member 31 is dislocated from the opening part 14, and a second position P2 in which the closing member covers the opening part 14.

Each closing member 31 includes a plate part 31A which is formed of metal material and has a rectangular shape, and a packing part 31B which is attached to one surface of the plate part 31A. The packing part 31B is formed of material such as synthetic rubber and has a ring shape. The packing part 31B has a size which is slightly larger than the opening part 14 and smaller than the outer edge of the plate part 31A. Each closing member 31 abuts against (is in close contact with) the housing 15 (the first wall 21 or the second wall 22) such that the packing part 31B surrounds the opening part 14, and thereby can seal the opening part 14 in a watertight (or airtight) manner.

Both the opening/closing mechanisms 32 (moving mechanisms) and the adhering mechanisms 34 are formed of, for example, electromagnets. Each opening/closing mechanism 32 can move (drop) the closing member 31 located in the first position P1 to the second position P2, by stopping electric power supply to the built-in coil and removing attraction (adhesion) by magnetic force for the closing member 31. Each adhering mechanism 34 can adhere the closing member 31, which is held by the receiving part 28 and located in the second position P2, to the housing 15 (door main body), by supplying electric power to the built-in coil.

As illustrated in FIG. 3 and FIG. 5, the air bags 35 are provided on, for example, the internal surfaces of the first wall 21 (front door, door part) and the second wall 22 (back door, door part). The air bags 35 may be fixed to the rack parts 12. As illustrated in FIG. 3, the air bags 35 can be changed between a contracted state 35A before expansion, and an expanded state 35B in which the air bags 35 are injected with gas from the gas injection module 36 and expanded between the internal surface of the housing 15 and the rack-mounted servers 13. The air bags 35 can maintain the shape of the expanded state 35B for a long time (about several hours to several days). When the server rack 11 is shaken by an earthquake or the like, the air bags 35 prevent the rack-mounted servers 13 from shooting out of the rack parts 12. In addition, if the server rack 11 is toppled by an earthquake or the like, the air bags 35 reduce shock applied to the rack-mounted servers 13, the UPSs 16, and the firewall.

The air bags 35 are provided in two positions, that is, between the rack-mounted servers 13 and the first wall 21

(that is, the front), and between the rack-mounted servers 13 and the second wall 22 (that is, the rear). The air bags 35 may be additionally provided between the rack-mounted servers 13 and the third walls 23 (that is, left and right sides).

The controller 44 includes, more specifically, a power supply control unit and a sensor control unit. The power supply control unit performs control to charge the battery 45, and power supply to the sensor control unit, in a state of being connected with the external power supply. The sensor control unit is directly connected to the first to third sensors 41 to 43, and monitors water caused by water spraying, and performs fire (smoke) monitoring and earthquake monitoring.

Next, control of the components performed by the controller 44 in an emergency will be explained with reference to FIG. 2 and the like. In a state of being connected with the external power supply (electric power supply from the exterior through the waterproof connector 37), the power supply control unit of the controller 44 performs control to charge the battery 45, and electric power supply to the sensor control unit. In addition, as described hereinafter, the following process differs according to which of the first to third sensors 41 to 43 senses an abnormal state first in an emergency.

(Case where First Sensor Senses an Abnormal State First)

In the case where the first sensor 41 senses an earthquake, the controller 44 instantly operates the gas injection module 36, and expands the air bags 35 between the rack-mounted servers 13 and the internal surfaces of the housing 15. This prevents the rack-mounted servers 13 from shooting out of the rack parts 12 when an earthquake occurs. Almost simultaneously with this operation, the controller 44 transmits an emergency power-off (EPO) signal to the PDU of the waterproof connector 37, and turns off the breaker of the waterproof connector 37 (stop power supply to the UPSs 16). Thereafter, power supply is changed to electric power supply by the battery 45. The battery 45 supplies electric power to the controller 44 (sensor control unit). The second sensor 42 and the third sensor 43, which are supplied with electric power from the sensor control unit, continue monitoring. The UPSs 16, power supply to which has been stopped, transmit a shut-down signal to the rack-mounted servers 13, and safely shut down the rack-mounted servers 13. Shutdown generally requires 5 minutes to 10 minutes.

Thereafter, when the third sensor 43 senses the occurrence of a fire or the second sensor 42 senses water spraying by a sprinkler, the controller 44 operates the opening/closing mechanisms 32 to move (drop) the closing members 31 from the first position P1 to the second position P2. In addition, the controller 44 operates the adhering mechanisms 34 to bring the closing members 31 into close contact with the door main body 26 of the first wall 21 and the door main body 26 of the second wall 22 (FIG. 5). Thereby, the opening parts 14 of the housing 15 are sealed in a watertight (or airtight) manner, and water is prevented from entering into the housing 15.

(Case where the Second Sensor or the Third Sensor Senses an Abnormal State First)

When the second sensor 42 which is capable of sensing water or the third sensor 43 which is capable of sensing smokes senses an abnormal state, the controller 44 operates the opening/closing mechanisms 32 to move (drop) the closing members 31 from the first position P1 to the second position P2. In addition, the controller 44 operates the adhering mechanisms 34 to bring the closing members 31 into close contact with the door main body 26 of the first wall 21 and the door main body 26 of the second wall 22, and seals the opening parts 14 of the housing 15 in a watertight (or airtight) manner (FIG. 5). This operation prevents water from entering into the housing 15.

Almost simultaneously with this, the controller 44 transmits an emergency power-off (EPO) signal to the PDU of the waterproof connector 37, and turns off the breaker of the waterproof connector 37 (stop power supply to the UPSs 16). Thereafter, power supply is changed to electric power supply by the battery 45. The battery 45 supplies electric power to the controller 44 (sensor control unit). The first sensor 41, which is supplied with electric power from the sensor control unit, continues monitoring. The UPSs 16, power supply to which has been stopped, transmit a shut-down signal to the rack-mounted servers 13, and safely shut down the rack-mounted servers 13.

Thereafter, when the first sensor 41 senses the occurrence of an earthquake, the controller 44 instantly operates the gas injection module 36, and expands the air bags 35 between the rack-mounted servers 13 and the internal surfaces of the housing 15 (FIG. 5). This operation prevents the rack-mounted servers 13 from shooting out of the rack parts 12 when an earthquake occurs.

According to the first embodiment, the server rack 11 comprises servers, a housing 15 which includes ventilation opening parts 14 and surrounds the servers, a water sensor which is provided outside the housing 15 and senses water, closing members 31, each of which is movable between a first position P1 in which the closing member 31 is dislocated from the opening part 14 and a second position P2 in which the closing member 31 covers the opening part 14, moving mechanisms which move the closing members 31 from the first position P1 to the second position P2, adhering mechanisms 34 which bring the closing members 31 that have moved to the second position P2 into close contact with the housing 15, and a controller 44 which operates the moving mechanisms and the adhering mechanisms 34 when the water sensor senses water.

In addition, an electronic apparatus protection method used in the first embodiment is a method which is used for an electronic apparatus including servers, a housing 15 which includes ventilation opening parts 14 and surrounds the servers, closing members 31, each of which is movable between a first position P1 in which the closing member 31 is dislocated from the opening part 14 and a second position P2 in which the closing member 31 covers the opening part 14, a first sensor 41, a second sensor 42, air bags 35, moving mechanisms, and adhering mechanisms 34, and the method comprises expanding the air bags 35 between the servers and the housing 15 when the first sensor 41 senses an earthquake, moving the closing members 31 from the first position P1 to the second position P2 by the moving mechanisms and bringing the closing members 31 that have moved to the second position P2 into close contact with the housing 15 by the adhering mechanisms 34 when the second sensor 42 senses water.

According to the above structures, since the housing 15 is sealed by the closing members 31 and the adhering mechanisms 34, it is possible to prevent water which is sprayed when a fire occurs from entering into the housing 15 and breaking the servers. In the same manner, even when a fire occurs inside the housing 15, it is possible to prevent the fire from spreading to the outside of the housing 15, by sealing the housing 15. In addition, according to the above protecting method, since the air bags 35 are expanded when an earthquake occurs, it is possible to prevent shocks applied to the servers, when the server rack 11 (electronic apparatus) is toppled by an earthquake. Thereby, it is possible to protect data which is stored in the servers, and easily recover the data from the servers later.

The server rack 11 includes an earthquake sensor which senses earthquakes, and air bags 35 which are expanded in a position between the server and an internal surface of the housing 15 when the earthquake sensor senses an earthquake. According to the structure, it is possible to prevent shocks applied to the servers, when the server rack 11 is toppled by an earthquake or the like. Thereby, it is possible to prevent breakage of a storage device (such as a hard disk drive and a flash memory) in the servers.

Each closing member 31 includes a plate part 31A which has a plate shape, and a packing part 31B which abuts against the housing 15 to surround the opening part 14. According to the structure, sealing (watertightness, airtightness) of the housing 15 can be further improved by the packing part 31B.

Both the moving mechanisms and the adhering mechanisms are formed of electromagnets. Therefore, the moving mechanisms and the adhering mechanisms 34 can be realized with a simple structure. In addition, both the moving mechanisms and the adhering mechanisms 34 require no mechanical parts, it is possible to realize the mechanisms with high durability and high reliability. Besides, each closing member 31 can be instantly moved from the first position P1 to the second position P2 by its own weight, and the response can be improved.

In this case, the server rack 11 includes receiving parts 28 which receive the closing members 31 which have moved to the second position P2, and each closing member 31 drops from the first position P1 to the second position P2 by removing attraction provided by the moving mechanism. According to this structure, even when movement of each closing member 31 is, due to its own weight, caused by toppling, the closing members 31 can be received by the receiving parts 28, and it is possible to prevent the closing members 31 from falling out.

Each closing member 31 is provided outside the housing 15. According to the structure, movement of the closing members 31 is not impeded by the expanded air bags 35.

Figure 7:
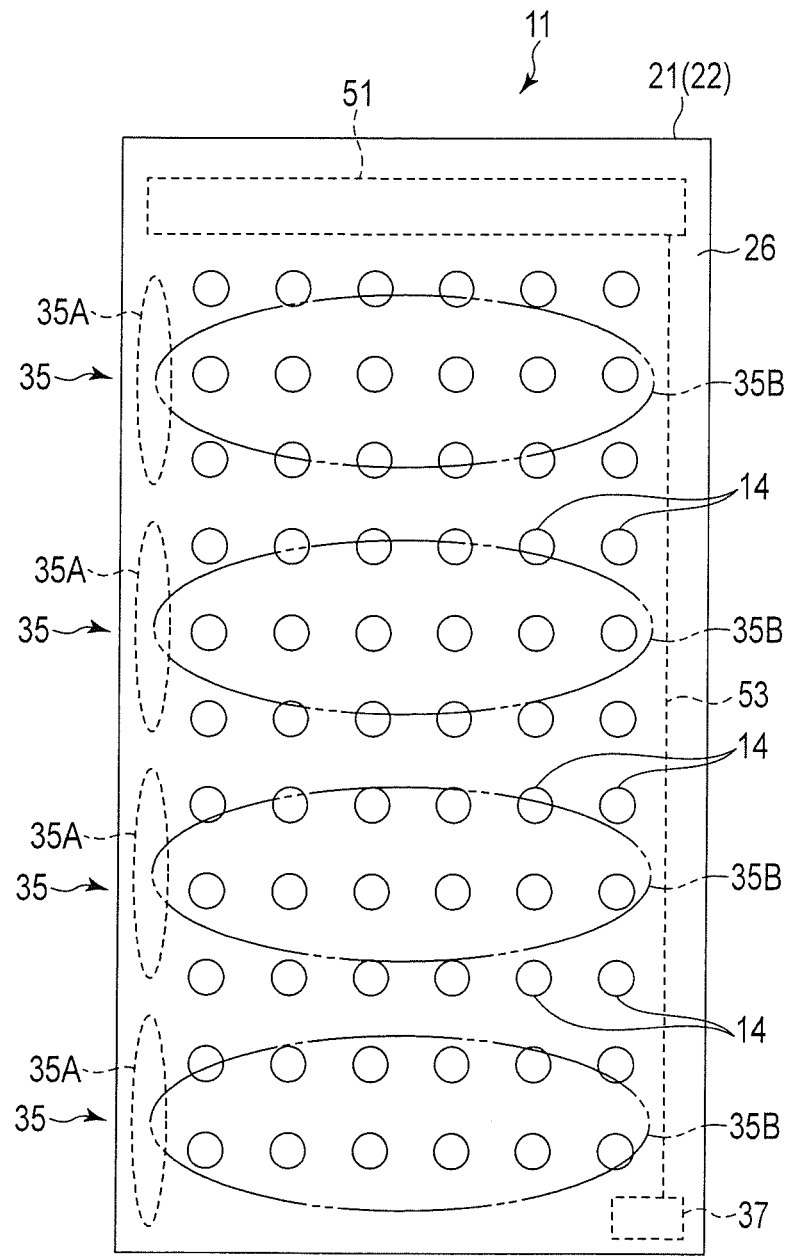
FIG. 7 is an exemplary front view of a first wall of a housing of the server rack illustrated in FIG. 6.
Figure 8:
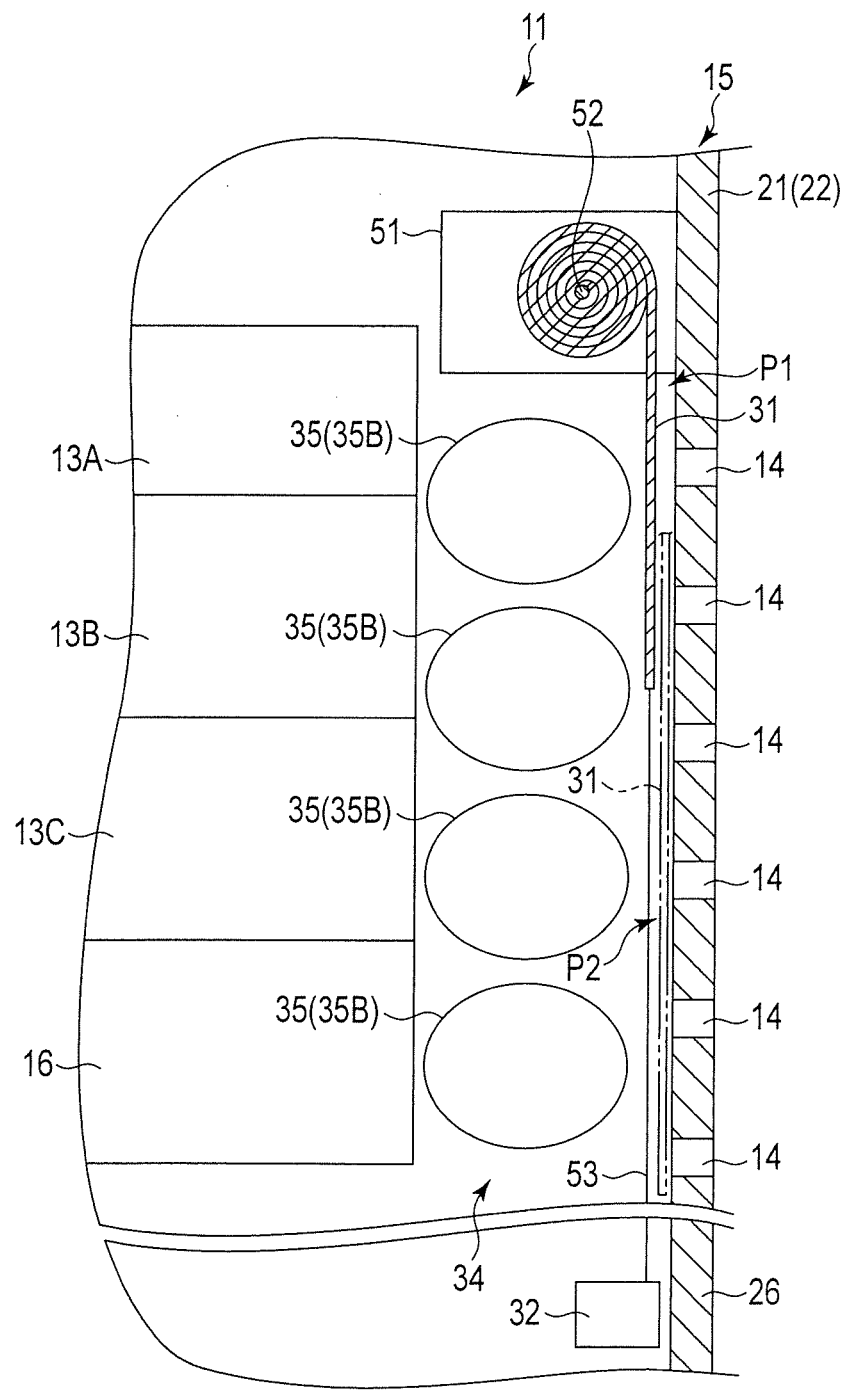
FIG. 8 is an exemplary cross-sectional view of a closing member, which is moving from a first position to a second position, and a part around the closing member, which are cut in a vertical direction, in the server rack illustrated in FIG. 6.

Next, a second embodiment of the electronic apparatus will be explained hereinafter with reference to FIG. 6 to FIG. 8. A server rack 11 which is an example of the electronic apparatus of the second embodiment is different from the server rack of the first embodiment in shape and arranged positions of the closing members 31, but is the same as the first embodiment in other parts. Therefore, parts of the server rack 11 of the second embodiment which are different from the first embodiment will be mainly explained, and parts which are the same as those of the first embodiment are omitted in the drawings, or denoted by like reference numerals and not explained hereinafter.

Closing members 31 are provided inside a housing 15. Each closing member 31 has a sheet-like shape, and is stored in a rolled state in a box-shaped storage part 51. Each closing member 31 is attached at one end to a shaft 52 which is provided inside the storage part 51. As illustrated in FIG. 8, a counterclockwise torque (rotational force) is always applied to the shaft 52, and the closing member 31 which has been drawn out of the storage part 51 can be wound around the shaft 52 again. Publicly-known means (such as a motor and a spring) can be used as means for applying a torque to the shaft 52.

In the present embodiment, a number of opening parts 14 are formed in a first wall 21 and a second wall 22, and each opening part 14 has a circular shape. The opening parts 14 are arranged in a lattice manner.

An opening/closing mechanism 32 is provided in the vicinity of a lower part (bottom) of the server rack 11. In the present embodiment, the opening/closing mechanism 32 (moving mechanism) is formed of a motor. The opening/closing mechanism 32 includes a rotating shaft, a reel which is rotated by receiving motive power transmitted from the rotating shaft, and a wire 53 (winding wire) which connects the reel with the other end of the closing member 31. The opening/closing mechanism 32 can winds up the wire 53 around the reel, and can draw the closing member 31 from the storage part and expand the closing member 31 (move the closing member 31 from the first position P1 to the second position P2) by rotating the reel. In the same manner, the opening/closing mechanism 32 can store the closing member 31 in the storage part 51 again, by rotating the rotating shaft and the reel in the opposite direction.

In the present embodiment, air bags 35 are also used as adhering mechanisms 34. Specifically, in the present embodiment, when the closing member 31 is in the second position P2 in which the closing member 31 covers the opening parts 14, the air bags 35, which are expanded between rack-mounted servers 13 (server) and the closing member 31, push the closing member 31 against the internal surface of the housing 15. Thereby, the opening parts 14 are sealed by the closing member 31.

When the air bags 35 are expanded earlier than movement of the closing member 31 to the second position P2, the quantity of the gas which is injected into the air bags 35 is controlled (gas filling percentage of about 80 to 90% for the whole capacity of the air bags 35), to prevent the expanded air bags 35 from contacting the moving closing member 31, or from impeding movement of the closing member 31 even when they contact the closing member 31. A controller 44 and a gas injection module 36 inject gas into the air bags 35 again after movement of the closing member 31 from the first position P1 to the second position P2 is finished, and thereby completely expand the air bags 35 (gas filling percentage of 100% for the whole capacity of the air bags 35), to bring the closing member 31 into close contact with the internal surface of the housing 15 by the air bags 35.

As another example, two types of air bags 35, which have different sizes, may be used. Specifically, when the air bags 35 are expanded earlier than movement of the closing member 31 to the second position P2, the controller 44 expands the smaller air bags 35. Thereby, a moving route of the closing member 31 from the first position P1 to the second position P2 is secured, and movement of the closing member 31 is not prevented. Then, after the closing member 31 has moved to the second position P2, the controller 44 expands the larger air bags 35 in addition to the smaller air bags 35, to bring the closing member 31 into close contact with the internal surface of the housing 15 by the larger air bags 35.

Next, control of the components which is performed by the controller 44 in an emergency will be explained hereinafter with reference to FIG. 6 and the like. In a state of being connected with the external power supply (electric power supply from the exterior through the waterproof connector 37), the power supply control unit of the controller 44 performs control to charge the battery 45, and electric power supply to the sensor control unit. In addition, as described hereinafter, the following process differs according to which of the first to third sensors 41 to 43 senses an abnormal state first in an emergency.

(Case where First Sensor Senses an Abnormal State First)

In the case where the first sensor 41 which senses an earthquake senses an abnormal state, the controller 44 instantly operates the gas injection module 36, and expands the air bags 35 between the rack-mounted servers 13 and the internal surfaces of the housing 15. This prevents the rack-mounted servers 13 from shooting out of the rack parts 12 when an earthquake occurs. In this operation, in preparation for expansion of the closing members 31 performed thereafter, the gas filling percentage in the air bags 35 is suppressed to, for example, about 80 to 90% for the whole capacity (or the smaller air bags 35 are expanded). Thereby, a predetermined space is left between the expanded air bags 35 and the internal surface of the housing 15.

Almost simultaneously with expansion of the air bags 35, the controller 44 transmits an emergency power-off (EPO) signal to a PDU of a waterproof connector 37, and turns off the breaker of the waterproof connector 37 (stop power supply to UPSs). Thereafter, power supply is changed to electric power supply by a battery 45. The battery 45 supplies electric power to the controller 44 (sensor control unit). The second sensor 42 and the third sensor 43, which are supplied with electric power from the sensor control unit, continue monitoring. The UPSs 16, power supply to which has been stopped, transmit a shut-down signal to the rack-mounted servers 13, and safely shut down the rack-mounted servers 13.

Thereafter, when the third sensor 43 senses the occurrence of a fire or the second sensor 42 senses water spraying by a sprinkler, the controller 44 operates the opening/closing mechanism 32 (motor) to move the closing members 31 from the first position P1 to the second position P2. In addition, the controller 44 operates the gas injection module 36 to increase the gas filling percentage in the air bags 35 to 100% (or expand the larger air bags 35). Thereby, the air bags 35 are completely expanded, and the air bags 35 bring the closing members 31 into close contact with a door main body 26 of the first wall 21 and a door main body 26 of the second wall 22. Thereby, water is prevented from entering into the housing 15.

(Case where the Second Sensor or the Third Sensor Senses an Abnormal State First)

When the second sensor 42 which can sense water or the third sensor 43 which can sense smokes senses an abnormal state, the controller 44 operates the opening/closing mechanism 32 (motor) to move the closing members 31 from the first position P1 to the second position P2. In addition, the controller 44 operates the gas injection module 36 to fill the air bags 35 with gas of a quantity which corresponds to the whole capacity of the air bags 35 (or expand the larger air bags 35). Thereby, the air bags 35 are completely expanded, and the air bags 35 bring the closing members 31 into close contact with the door main body 26 of the first wall 21 and the door main body 26 of the second wall 22. This operation prevents water from entering into the housing 15.

Almost simultaneously with this, the controller 44 transmits an emergency power-off (EPO) signal to the PDU of the waterproof connector 37, and turns off the breaker of the waterproof connector 37 (stop power supply to the UPSs 16). Thereafter, power supply is changed to electric power supply by the battery 45. The battery 45 supplies electric power to the controller 44 (sensor control unit). The first sensor 41, which is supplied with electric power from the sensor control unit, continues monitoring. The UPSs 16, power supply to which has been stopped, transmit a shut-down signal to the rack-mounted servers 13, and safely shut down the rack-mounted servers 13.

Thereafter, even when the first sensor 41 senses the occurrence of an earthquake, since the air bags 35 have already been expanded with 100% of gas filling percentage (or the larger air bags 35 have been expanded), the rack-mounted servers 13 are prevented from shooting out of the rack parts 12 when an earthquake occurs.

According to the second embodiment, the closing members 31 are provided inside the housing 15, and the air bags 35 also serve as the adhering mechanisms 34.

According to the above structure, the air bags 35 not only improve shock resistance of the server rack 11, but also improve adhesion of the closing members 31 to the housing 15. Thereby, it is possible to reduce the number of parts and simplify the structure, in comparison with the case of forming the adhering mechanism 34 separately.

Next, a third embodiment of the electronic apparatus will be explained hereinafter with reference to FIG. 9 and FIG. 10. A server rack 11 which is an example of the electronic apparatus of the third embodiment is different from the server rack of the first embodiment in arranged positions of the closing members 31, the receiving parts 28, the opening/closing mechanisms 32, the adhering mechanisms 34, and the fan units 33, but is the same as the first embodiment in other parts. Therefore, parts of the server rack 11 of the third embodiment which are different from the first embodiment will be mainly explained, and parts which are the same as those of the first embodiment are omitted in the drawings, or denoted by like reference numerals and not explained hereinafter.

The structures of closing members 31, receiving parts 28, opening/closing mechanisms 32, adhering mechanisms 34, and fan units 33 are the same as those of the first embodiment. The closing members 31 and the receiving parts 28 are provided inside the housing 15, unlike the first embodiment. The opening/closing mechanisms 32, the adhering mechanisms 34, and the fan units 33 are provided outside the housing 15, unlike the first embodiment.

Although the adhering mechanisms 34 (electromagnets) are provided in the present embodiment like the first embodiment, air bags 35 may be used as the adhering mechanisms 34, by a method similar to the second embodiment.

Next, control of the components performed by a controller 44 in an emergency will be explained with reference to FIG. 9 and FIG. 10. In a state of being connected with the external power supply (electric power supply from the exterior through a waterproof connector 37), a power supply control unit of the controller 44 performs control to charge a battery 45, and electric power supply to a sensor control unit. In addition, as described hereinafter, the following process differs according to which of first to third sensors 41 to 43 senses an abnormal state first in an emergency.

(Case where First Sensor Senses an Abnormal State First)

In the case where the first sensor 41 senses an earthquake, the controller 44 instantly operates the gas injection module 36, and expands a plurality of air bags 35 between rack-mounted servers 13 and internal surfaces of the housing 15. This prevents the rack-mounted servers 13 from shooting out of rack parts 12 when an earthquake occurs. The gas filling percentage in the air bags 35 in this operation is, for example, about 80 to 90% for the whole capacity (or the smaller air bags 35 are expanded), like the second embodiment. Thereby, a predetermined space is left between the expanded air bags 35 and the internal surface of the housing 15, and prevents the air bags 35 from impeding movement of the closing members 31. As another example, two types of air bags 35, which have different sizes, may be used to prevent the air bags 35 from impeding movement of the closing members 31 from a first position P1 to a second position P2, like the second embodiment.

Almost simultaneously with expansion of the air bags 35, the controller 44 transmits an emergency power-off (EPO) signal to a PDU of a waterproof connector 37, and turns off the breaker of the waterproof connector 37 (stop power supply to UPSs 16). Thereafter, power supply is changed to electric power supply by a battery 45. The battery 45 supplies electric power to the controller 44 (sensor control unit). The second sensor 42 and the third sensor 43, which are supplied with electric power from the sensor control unit, continue monitoring. The UPSs 16, power supply to which has been stopped, transmit a shut-down signal to the rack-mounted servers 13, and safely shut down the rack-mounted servers 13.

Figure 9:
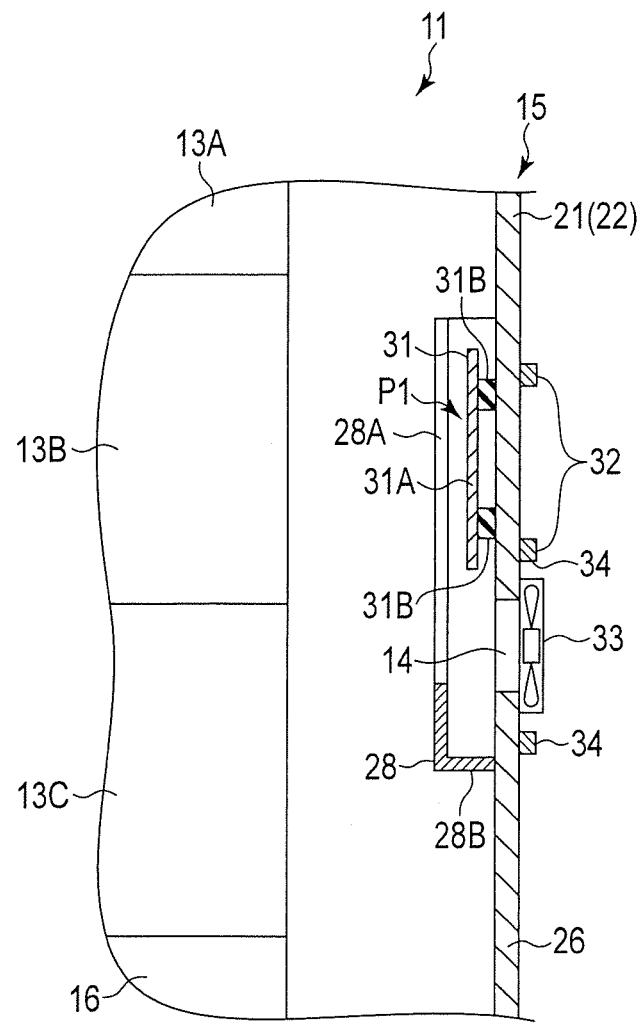
FIG. 9 is an exemplary cross-sectional view of a closing member located in a first position and a part around the closing member, which are cut in a vertical direction, in a server rack which is an example of an electronic apparatus according to a third embodiment.

Thereafter, when the third sensor 43 senses the occurrence of a fire or the second sensor 42 senses water spraying by a sprinkler, the controller 44 operates the opening/closing mechanisms 32 to move (drop) the closing member 31 from the first position P1 to the second position P2 (FIGS. 9 and 10). In addition, the controller 44 operates the gas injection module 36 to increase the gas filling percentage in the air bags 35 to 100% (or expand the larger air bags 35). Thereby, the air bags 35 are completely expanded, and the air bags 35 bring the closing members 31 into close contact with a door main body 26 of a first wall 21 and a door main body 26 of a second wall 22 (FIG. 10). If necessary, the controller 44 can operate the adhering mechanisms 34 to bring the closing members 31 into close contact with the door main body 26 of the first wall 21 and the door main body 26 of the second wall 22. Water is prevented from entering into the housing 15, since the air bags 35 push the closing members 31 against the door main body 26 of the first wall 21 and the door main body 26 of the second wall 22 and the adhering mechanisms 34 attract the closing members 31.

(Case where the Second Sensor or the Third Sensor Senses an Abnormal State First)

When the second sensor 42 which is capable of sensing water or the third sensor 43 which is capable of sensing smokes senses an abnormal state, the controller 44 operates the opening/closing mechanisms 32 to move (drop) the closing members 31 from the first position P1 to the second position P2 (FIGS. 9 and 10). In addition, the controller 44 operates the gas injection module 36 to fill the air bags 35 with gas of a quantity which corresponds to the whole capacity of the air bags 35 (or expand the larger air bags 35) (FIG. 10). The controller 44 can also operate the adhering mechanisms 34, if necessary. This operation improves adhesion of the closing members 31 to the door main body 26 of the first wall 21 and the door main body 26 of the second wall 22. These operations prevent water from entering into the housing 15.

Almost simultaneously with this, the controller 44 transmits an emergency power-off (EPO) signal to the PDU of the waterproof connector 37, and turns off the breaker of the waterproof connector 37 (stop power supply to the UPSs 16). Thereafter, power supply is changed to electric power supply by the battery 45. The battery 45 supplies electric power to the controller 44 (sensor control unit). The first sensor 41, which is supplied with electric power from the sensor control unit, continues monitoring. The UPSs 16, power supply to which has been stopped, transmit a shut-down signal to the rack-mounted servers 13, and safely shut down the rack-mounted servers 13.

Thereafter, even when the first sensor 41 senses the occurrence of an earthquake, since the air bags 35 have already been expanded with 100% of gas filling percentage (or the larger air bags 35 have been expanded), the rack-mounted servers 13 are prevented from shooting out of the rack parts 12 when an earthquake occurs.

According to the third embodiment, since the closing members 31 are provided inside the housing 15, the structure of bring the closing members 31 into close contact with the housing 15 can be achieved by the air bags 35. In addition, when both the air bags 35 and the adhering mechanisms 34 are used for fixing the closing members 31, it is possible to reduce the risk that the closing members 31 are dislodged from the second position P2 by an earthquake, even when an earthquake occurs thereafter.

The electronic apparatus is not limited to the above embodiments, but may be carried out by modifying the constituent elements within a range not departing from the gist. For example, when two types of air bags 35 having different sizes are used in the second and third embodiments, the following method may be used. Specifically, when the larger air bags 35 are expanded after the closing member 31 has been moved to the second position P2, the larger air bags 35 may be additionally expanded, with the smaller air bags 35 kept expanded, to bring the closing member 31 into close contact with the housing 15. As another method, the larger air bags 35 may be alternatively expanded after the smaller air bags 35 are contracted by operating the gas injection module 36 with reverse rotation, to bring the closing member 31 into close contact with the housing 15.

Although the battery 45 is separately provided in addition to the UPS 16 in each of the above embodiments, the UPS 16 may also serve as the battery 45. In addition, the structures of the first to third embodiments may be used in combination, by changing the first wall 21 (front door, door part) or the second wall 22 (back door, door part) thereof to those of the other embodiments.

Various inventions can be made by proper combination of constituent elements which are disclosed in the above embodiments. For example, some constituent elements may be deleted from the constituent elements disclosed in the embodiment. In addition, constituent elements of different embodiments may be used in combination.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A server rack comprising:
   a server;
   a housing which includes a ventilation opening part, and surrounds the server;
   a water sensor which is provided outside the housing and senses water;
   a closing member which is movable between a first position in which the closing member is dislocated from the opening part and a second position in which the closing member covers the opening part;
   a moving mechanism which moves the closing member from the first position to the second position;
   an adhering mechanism which brings the closing member that has moved to the second position into close contact with the housing; and
   a controller which operates the moving mechanism and the adhering mechanism, when the water sensor senses water.

2. The server rack of claim 1, further comprising:
   an earthquake sensor which senses an earthquake; and
   an air bag which is expanded in a position between the server and an internal surface of the housing, when the earthquake sensor senses an earthquake.

3. The server rack of claim 2, wherein
   the closing member includes a plate part which has a plate-like shape, and a packing part which abuts against the housing to surround the opening part.

4. The server rack of claim 3, wherein
each of the moving mechanism and the adhering mechanism is an electromagnet.

5. The server rack of claim 4, further comprising:
a receiving part which receives the closing member that has moved to the second position,
wherein the closing member drops from the first position to the second position, when attraction provided by the moving mechanism is removed.

6. The server rack of claim 5, wherein
the closing member is provided outside the housing.

7. The server rack of claim 2, wherein
the closing member is provided inside the housing, and
the air bag also serves as the adhering mechanism.

8. An electronic apparatus comprising:
a server;
a housing which includes an opening part and surrounds the server;
a sensor which is provided to be exposed to outside and senses water;
a closing member which is movable between a first position in which the closing member is dislocated from the opening part and a second position in which the closing member covers the opening part;
a moving mechanism which moves the closing member from the first position to the second position, when the sensor senses water; and
an adhering mechanism which brings the closing member that has moved to the second position into close contact with the housing.

9. An electronic apparatus protection method, which is used for an electronic apparatus that includes a server, a housing that includes an opening part and surrounds the server, a closing member which is movable between a first position in which the closing member is dislocated from the opening part and a second position in which the closing member covers the opening part, a first sensor, a second sensor, an air bag, a moving mechanism, and an adhering mechanism, the method comprising:
expanding the air bag between the server and the housing when the first sensor senses an earthquake; and
moving the closing member from the first position to the second position by the moving mechanism, and bringing the closing member which has moved to the second position into close contact with the housing by the adhering mechanism, when the second sensor senses water.

10. The electronic apparatus protection method of claim 9, wherein
the moving mechanism is an electromagnet, and the closing member is dropped from the first position to the second position by removing attraction by the electromagnet when the second sensor senses water.

11. The electronic apparatus protection method of claim 9, wherein
the closing member is provided inside the housing, the air bag is expanded to bring the closing member that has moved to the second position into close contact with the housing when the second sensor senses water, and thereby the air bag is used as the adhering mechanism.

* * * * *